United States Patent
Vogg et al.

(12) United States Patent (10) Patent No.: US 7,402,891 B2
Vogg et al. (45) Date of Patent: Jul. 22, 2008

(54) SEMICONDUCTOR POLYMERS, METHOD FOR THE PRODUCTION THEREOF AND AN OPTOELECTRONIC COMPONENT

(75) Inventors: Günther Vogg, Pullach (DE); Martin Brandt, Garching (DE); Martin Stutzmann, Erding (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 604 days.

(21) Appl. No.: 10/239,963

(22) PCT Filed: Mar. 26, 2001

(86) PCT No.: PCT/DE01/01140

§ 371 (c)(1),
(2), (4) Date: Jan. 13, 2003

(87) PCT Pub. No.: WO01/73862

PCT Pub. Date: Oct. 4, 2001

(65) Prior Publication Data

US 2003/0151117 A1 Aug. 14, 2003

(30) Foreign Application Priority Data

Mar. 26, 2000 (DE) .................. 100 14 287

(51) Int. Cl.
*H01L 33/00* (2006.01)

(52) U.S. Cl. .................. 257/616; 257/40; 257/103; 257/449

(58) Field of Classification Search .................. 257/103, 257/40, 616, 617, 66, 101, 104, 620, 626, 257/628, 631, 606, 614, 449, 102, 59, 72, 257/E33.037, E51.046; 438/449, 752; 310/309, 310/310, 339, 363

See application file for complete search history.

(56) References Cited

U.S. PATENT DOCUMENTS

| | | | |
|---|---|---|---|
| 4,271,084 A * | 6/1981 | Ishikawa et al. | 556/83 |
| 4,778,692 A * | 10/1988 | Ishihara et al. | 427/568 |
| 5,220,181 A | 6/1993 | Kanai et al. | |
| 5,280,183 A | 1/1994 | Batzel et al. | |

(Continued)

FOREIGN PATENT DOCUMENTS

EP 0 545 388 A1 11/1996

(Continued)

OTHER PUBLICATIONS

Freundlich et al., "Calcium Germanides; Preparation and Properties", (1959) Chemical Abstract, Sorbonne, pp. 709-712.

(Continued)

*Primary Examiner*—Thomas L Dickey
*Assistant Examiner*—Fazli Erdem
(74) *Attorney, Agent, or Firm*—Fish & Richardson P.C.

(57) ABSTRACT

Layered germanium polymers that are semiconductive and demonstrate a strong red or infrared luminescence are produced through the topochemical conversion of calcium digermanide. Furthermore, silicon/germanium layer polymers can also be produced in this manner. These layer polymers can be produced epitaxially on substrates comprising crystalline germanium, and can be used to construct light-emitting optoelectronic components such as light-emitting diodes or lasers.

32 Claims, 5 Drawing Sheets

U.S. PATENT DOCUMENTS

Figure 1:
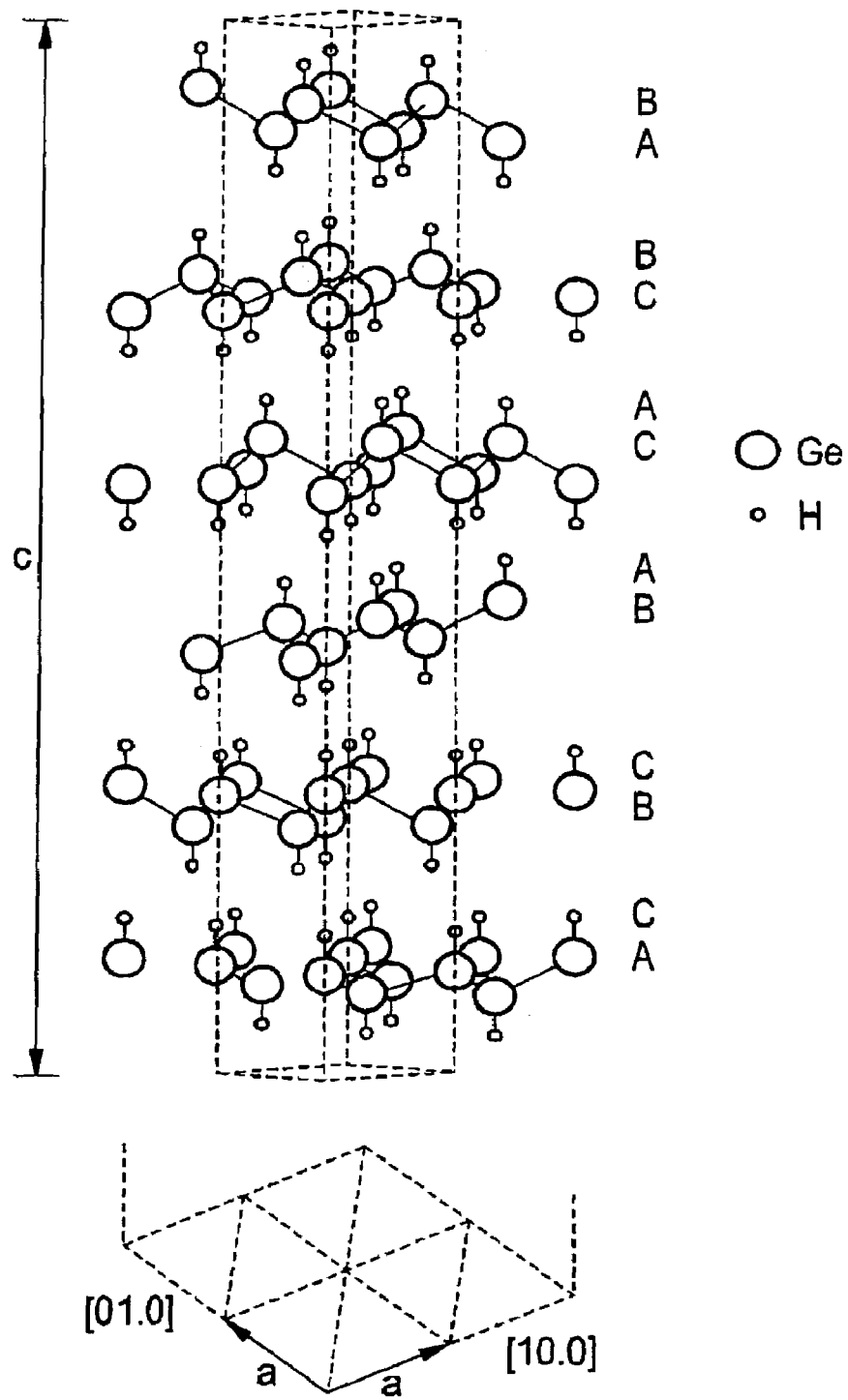

| | | | | |
|---|---|---|---|---|
| 5,437,929 | A | * | 8/1995 | Kenney et al. ............ 428/411.1 |
| 5,578,379 | A | | 11/1996 | Stutzmann et al. |
| 5,624,705 | A | | 4/1997 | Stutzmann et al. |
| 6,316,098 | B1 | * | 11/2001 | Yitzchaik et al. ............. 428/339 |
| 6,452,218 | B1 | * | 9/2002 | Cao ........................... 257/103 |

FOREIGN PATENT DOCUMENTS

| | | | |
|---|---|---|---|
| JP | 8-231947 | | 9/1996 |
| JP | 8-231949 | | 9/1996 |
| JP | 9-64417 | | 3/1997 |
| JP | 10-180933 | * | 7/1998 |

OTHER PUBLICATIONS

Evers, J. et al., "Electrical Properties of Alkaline Earth Disilicides and Digermandes", Mat. Res. Bulletin, vol. 9, (1974), Munich, pp. 549-553.

Belissent, R. et al., "Observation of a Polymer Like Short Range Order in a- $Ge_{1-x}$: $H_x$ by X-ray and Neutron Scattering", Journal of Non-Crystalline Solids 77 & 78, (1985), Holland, pp. 229-232.

Vogg, G. et al., "From $CaSi_2$ to Siloxene: Epitaxial Silicide and Sheet Polymer Films on Silicon", Journal of Crystal Growth 203, No. 4, (1999), Munich, pp. 570-581.

Takeda, K. et al., Theoritical Study on the Electronic Structure of SI-Ge Copolymers, Journal of American Chemical Society, vol. 112, No. 19, (1990), pp. 5043-5052.

Wallbaum, H.J., Naturwissenschaften (1994), pp. 32, 76.

Weiss, A. et al., "The Topochemical Reaction of $CaSi_2$ to a Two-Dimensional Subscilious Acid $Si_5H_3(OH)_3$ (= Kautskys Siloxene)", (1979), Munich, pp. 25-30.

Szymanski, W. J. et al., "Polygermynes: Synthesis and Properties of Germanium-Germanium Bonded Network Polymers", Macromolecules: Journal of American Chemical Society, (1993), pp. 869-871.

Kishida, H. et al., "Optical Spectra of Si/Ge-network Copolymers: $[Si(C_6H_{13})]1-x[Ge(C_6H_{13})]x$", Applied Physics Letter, vol. 65, No. 11, (1994) American Institute of Physics, pp. 1358-1360.

Kautsky, H., "Uber einige ungesattigte Siliciumverbindungen", (1921) pp. 209-242.

Wohler, F., "Ueber Verbindungen des Siliciums mit Sauerstoff and Wasserstoff", (1863) p. 257-275.

Vogg, G. et al., "Polygermyne-a Prototype System for Layered Germanium Polymers", Advanced Materials, Bd. 12, No. 17, Germany (2000), pp. 1278-1281.

Venkatasubramanian, R. et al., "Physical Basis and Characteristics of Light Emission from Quantized Planar Ge Structures", IEEE, (1991), US, pp. 429-432.

Vogg, G., et al., "Efficient tunable luminescence of SiGe alloy sheet polymers", Jun. 18, 2001, Applied Physics Letters, vol. 78, No. 25, pp. 3956-3958.

Vogg, G. et al., "Polygermananosilyne Calcium Hydroxide Intercalation Compounds Formed by Topotactic Transformation of $Ca(Si_{1-x} Ge_x)_2$ Alloy Zintl Phases in Ambient Atmosphere", Oct. 2001, Monatshefte für Chemie 132/2001, pp. 1125-1135.

* cited by examiner polygermin B
tr6 Ca(OH)$_2$(GeH)$_2$ $c = 65.3$ D polygermin A
tr6 (GeH)$_n$ $c = 33.9$ D

- Ca
- Ge
- OH
- H

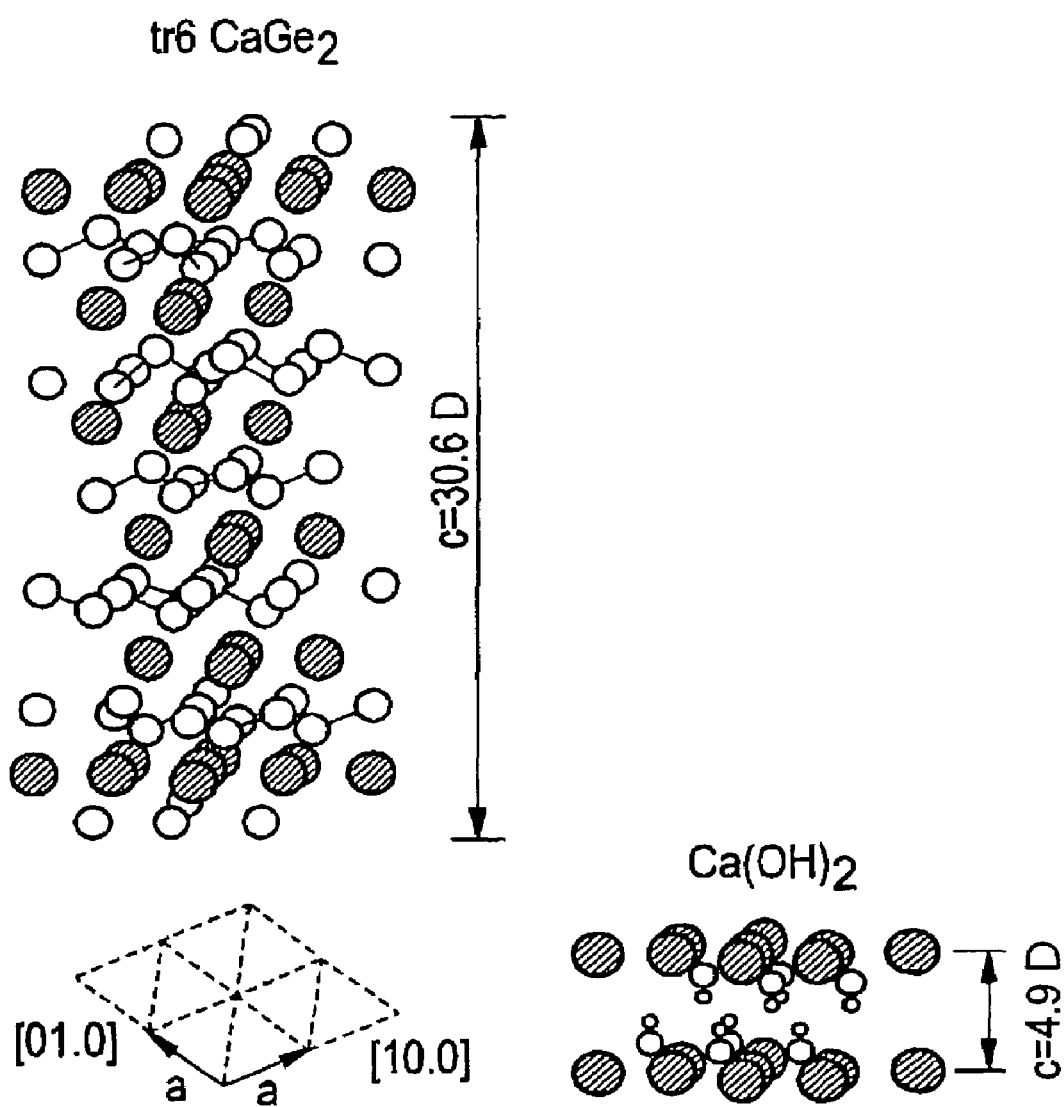

SEMICONDUCTOR POLYMERS, METHOD FOR THE PRODUCTION THEREOF AND AN OPTOELECTRONIC COMPONENT

Crystalline germanium is used in a large number of optoelectronic components, particularly as a radiation detector. However, optoelectronic components such as light-emitting diodes or lasers, for example, which emit in the visible or the near-to middle-infrared spectrum range, cannot be constructed from this material, because the indirect band gap of crystalline germanium prevents radiating transitions between the conduction band and the valence band.

If the particular properties of germanium are supposed to be used for the detection of optical radiation in integrated optoelectronic circuits that are also supposed to contain light-emitting components, other semiconductor materials, such as III-V connecting semiconductors, for example, must be used for the production of these light-emitting components. However, the methods required for linking different semiconductors generally are technically complicated.

Luminescent chained germanium polymers of the form $(GeR_2)_n$ are known, where R stands for univalent ligands such as H, OH, $CH_3$, $NH_2$, Cl, etc. These polymers are produced by polymerization and can be deposited onto many different substrates, such as glass or conductive transparent oxides.

In the use of such polymers on substrates comprising crystalline germanium, there are no particular advantages as compared with the use of other luminescent semiconductor materials; in particular, electronically active defects can form at the interface between crystalline germanium and these germanium polymers, thereby significantly impairing the properties of the light-emitting components produced in this way.

So-called statistical network polymers, which are produced by polymerization (Wurtz coupling) are also known (W. J. Szymanski, G. T. Visscher, P. A. Bianconi, Macromolecules 26, 869 (1993); H. Kishida, H. Tachibana, M. Matsumoto, Y. Tokura, Appl. Phys. Lett. 65, 1358 (1994)).

These network polymers, which are obtained by means of polymerization, possess a three-dimensionally chained, amorphous structure, and demonstrate only weak photoluminescence at a wavelength of 540 nm.

For calcium disilicide $CaSi_2$, it has already been known since 1863 that the calcium atoms can be removed from the crystal lattice of the $CaSi_2$ by placing it in hydrochloric acid, and that a layered silicon polymer forms (F. Wöhler, Liebigs Annalen [Annals] 127, 257 (1863)). This involves a so-called topochemical conversion, in which the structure and the stacking sequence of the Si surface planes present in this material are retained (A. Weiss, G. Beil, H. Meyer, Z. Naturforsch. [Journal of Natural Science] 35b, 25 (1979)). This reaction is preferably carried out at 0° C. (H. Kautsky, Z. anorg. Chem. [Inorganic Chemistry] 117, 209 (1921)).

It is the object of the invention to provide semiconductor polymers with improved luminescence properties, as well as a method for producing them. It is a further object of the invention to create an optoelectronic component with the polymers.

This object is accomplished by the characteristics of claims 1, 13, 18, and 34, respectively. Advantageous modifications of the invention ar dependent claims.

The invention will be explained in greater detail below, in connection with FIGS. 1 through 5.

Figure 2A:
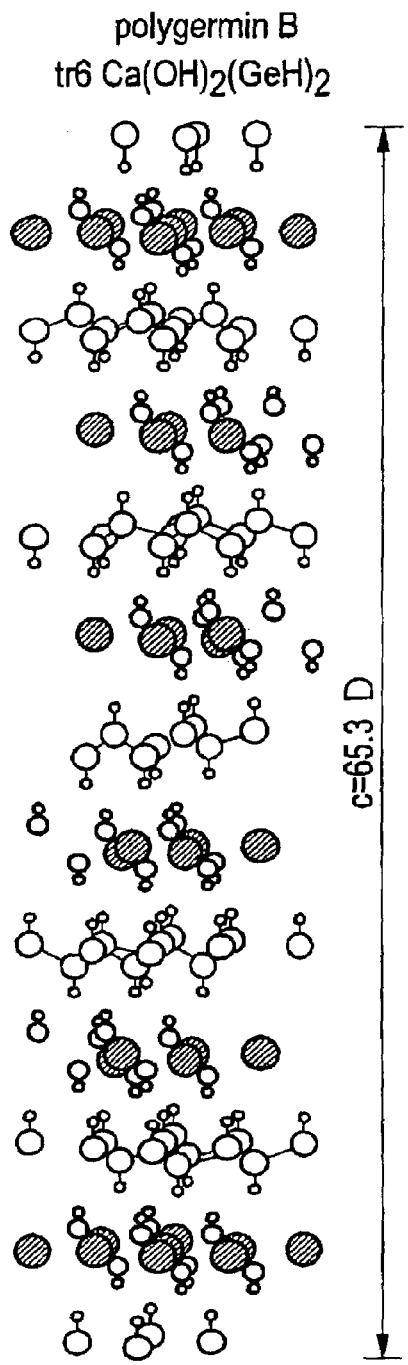
Figure 2B:
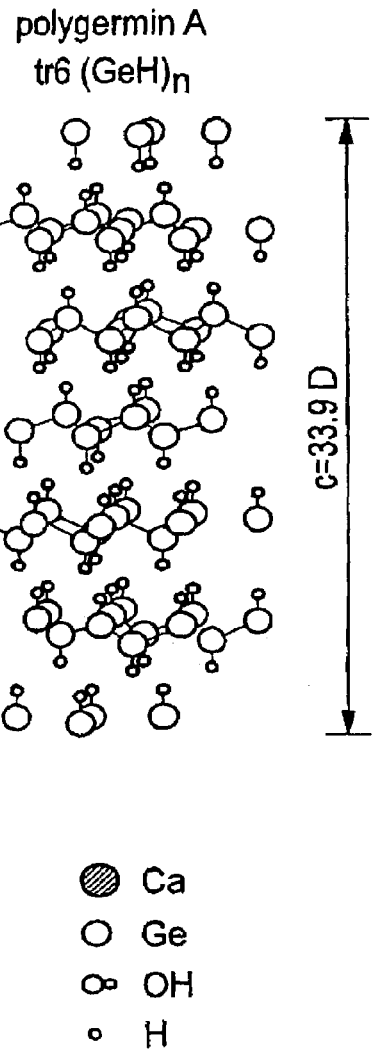
Figure 3:
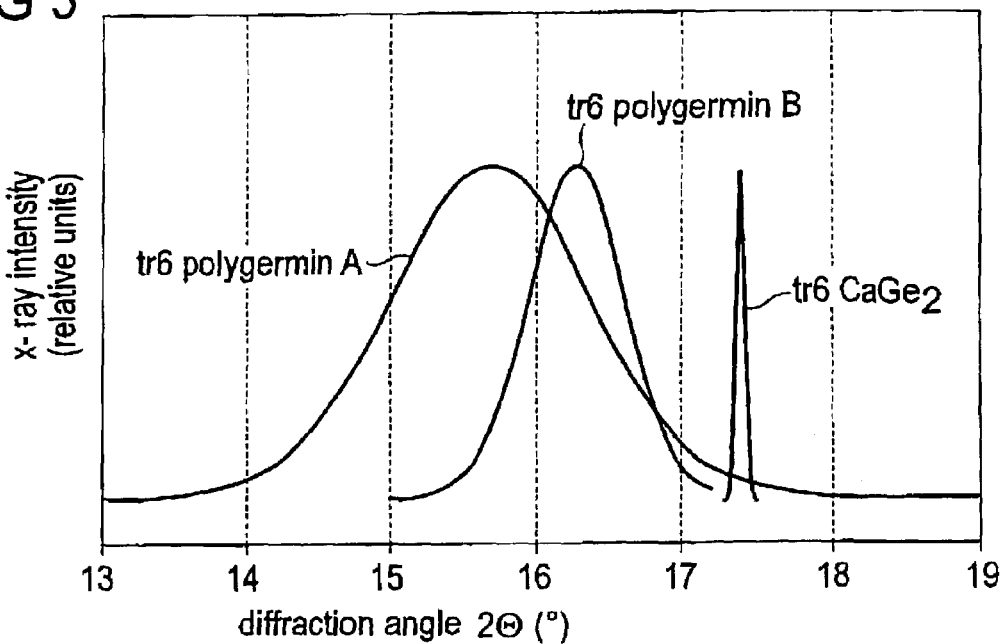
Figure 4:
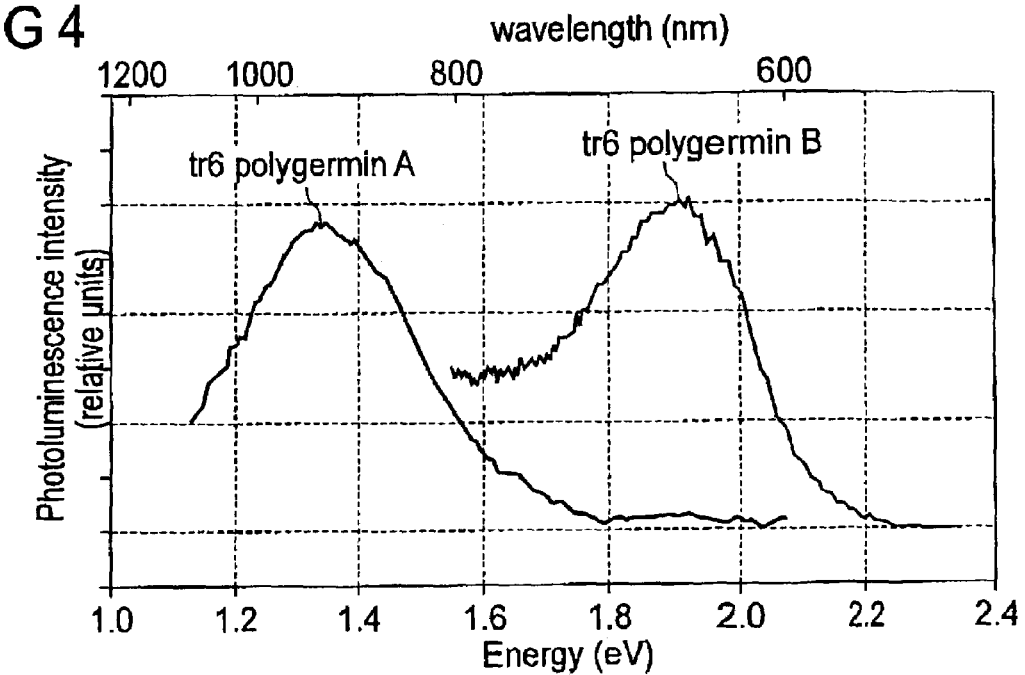

These show:

FIG. 1 a schematic view of the structural design of a first embodiment of a germanium layer polymer;

FIG. 2 a schematic view of the structural design of a second embodiment of a germanium layer polymer in comparison with the structural form of the first embodiment, and of a material for the production of these layer polymers;

FIG. 3 an X-ray diffractogram showing the two embodiments according to FIGS. 1 and 2, as well as the material for the production of the layer polymers;

FIG. 4 a photoluminescence spectrum of the two embodiments; and

Figure 5:
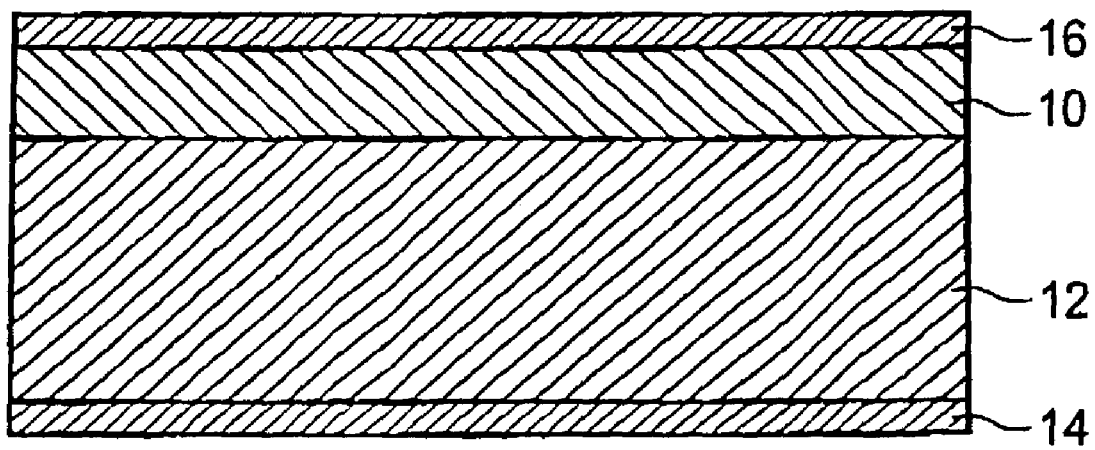

FIG. 5 a schematic, sectional view of an optoelectronic component in accordance with the invention.

According to the invention, germanium polymers or silicon-germanium polymers are formed by the topochemical conversion of suitable germanides or mixed silicide-germanides, respectively, for example through the reaction of $Ca(Si_{1-x}Ge_x)_2$, $0 < x \leq 1$.

Preferably, a crystalline substrate with a suitable crystal structure, or a substrate with a buffer layer that has a suitable crystal structure, is used for this purpose. In this connection, the buffer layer can also have several layers. Germanium substrates or germanium-silicon substrates are particularly suitable. In this connection, the layer polymers form an epitaxial film on the substrate, and electronically active defects at the interface are formed only to a very limited extent.

For the production of the layered germanium polymers, the germanide $CaGe_2$ is first formed by the reaction of Ca with germanium. This can be effected through the deposition of Ca, using a suitable application process, onto a germanium substrate, with subsequent tempering to form CaGe2, through the deposition of Ca onto a heated germanium substrate, causing $CaGe_2$ to form without subsequent tempering (reactive deposition epitaxy), or by the co-deposition of Ca and Ge onto a substrate, preferably a germanium substrate (by means of vapor deposition, sputtering, or molecular beam epitaxy, for example), and subsequent tempering, or through co-deposition onto a heated germanium substrate.

Preferably, epitaxial $CaGe_2$ is produced on crystalline germanium by means of reactive deposition epitaxy with the temperature of the germanium substrate being 700 to 900° C. and with a calcium flow of approximately 10 nm per minute. A temperature of 810° C. is particularly preferred. At that temperature, a growth rate of approximately 1 μm per hour is achieved.

Calcium digermanide can crystallize in two crystal structures: tr6 $CaGe_2$ (spatial group $D_{3d}^5$) with the lattice constants a=4.0 Å and c=30.6 Å and h2 $CaGe_2$ (spatial group $C_{6v}^4$) with the lattice constants a=4.0 Å and c=10.2 Å. The crystal structure of tr6 $CaGe_2$ is shown in FIG. 2c. This is a layered structure that comprises a sequence of undulated germanium (double) surface planes and surface planes comprising calcium atoms (H. J. Wallbaum, Naturwissenschaften [Natural Sciences] 32, 76 (1944)). In tr6 $CaGe_2$ there is a sextuple stacking sequence, while in h2 $CaGe_2$ there is only a double stacking sequence.

The conversion of $CaGe_2$ into layered germanium polymers is brought about by means of a topochemical conversion. In order to obtain luminescent layered germanium polymers in which the surface plane structure of the germanium atoms is retained, according to the invention, the reaction is carried out in a solution that contains HCl, preferably at temperatures below −5° C., especially preferably in concentrated HCl (37% in water) at −30° C. Under these conditions, layered germanium polymers of the form $(GeH)_n$ with the chemical name polygermin are formed; these are extensively free of oxygen and chlorine contaminants.

A first form of germanium layer polymers that are obtained by reaction in HCl is referred to as polygermin A.

The structure of polygermin A is shown schematically in FIG. 1. The conversion of tr6 $CaGe_2$ with HCl yields a tr6

(GeH)$_n$ with the same spatial group D$_{3d}^5$) as tr6 CaGe$_2$ and with the lattice constants a=4.0 Å and c=33.9 Å, and analogously, in the conversion of h2 CaGe$_2$, an h2 (GeH)$_n$ is formed.

Because there is only a weak bond remaining between adjacent (GeH)$_n$ surface planes, turbostratic disorder occurs between the surface planes and a variation of the surface plane distance c/6 between 5.4 and 5.9 Å, as can be seen from the width of the X-ray diffractogram of the (006) reflex of tr6 (GeH)$_n$, shown in FIG. 3, which was taken using CuK$_\alpha$ radiation with a Bragg-Brentano geometry. Like the original CaGe$_2$ film, the (GeH)$_n$ film obtained by means of a topochemical conversion is oriented epitaxially relative to the germanium substrate.

FIG. 4 shows a photoluminescence spectrum of polygermin A. The layer polymer demonstrates a strong infrared photoluminescence at approximately 900 nm (1.4 eV). This luminescence is clearly more strongly defined than in the germanium network polymers indicated initially.

Luminescence in the near-infrared wavelength range, together with photodiodes made of germanium, has particular advantages for uses of these layer polymers in integrated optoelectronic components, because it is significantly closer to the highest spectral sensitivity of crystalline germanium.

In a second method according to the invention, germanium layer polymers are produced through a topochemical conversion of CaGe$_2$ using water instead of hydrochloric acid. In this connection, CaGe$_2$ is preferably exposed to humid air, especially preferably at a relative humidity between 10 and 100% and at a temperature between 10 and 30° C. Alternatively, germanium layer polymers can be produced by placing CaGe$_2$ or substrates coated with CaGe$_2$ in water.

In this reaction, removal of the calcium atoms from the crystal lattice does not occur; instead, additional water is built into the crystal. Depending on the crystal structure of the initial CaGe$_2$ material being used, again crystalline layer polymers with a tr6 or h2 structure will be obtained. These layer polymers possess a layer structure with alternating layers that contain Ge and Ca.

Germanium layer polymers produced by exposing CaGe$_2$ to humid air or placing it in water will be referred to hereinafter as polygermin B. Their structural form is shown in FIG. 2a for the tr6 crystal structure. For comparison purposes, FIG. 2b shows the structure of polygermin A, and FIG. 2c illustrates the structure of CaGe$_2$.

Polygermin B, like polygermin A, has (GeH)$_n$ layer planes. In contrast to polygermin A, these layer planes are separated from one another by ((CaOH)$_2$)$_n$ planes. The lattice constants are a=4.0 Å and c=65.3 Å, where the distance between adjacent germanium surface planes varies between c/6=10.6 Å and 11.0 Å for the reasons outlined above (See FIG. 3). Polygermin B reacted in humid air demonstrates a strong photoluminescence at 650 nm (see FIG. 4).

The distance between the germanium surface planes, as well as the size of the band gap, and therefore the wavelength of the luminescence, can be changed through the chemical substitution of the hydrogen by other suitable ligands at the germanium surface planes in polygermin. In this connection, the H atoms can be substituted entirely or in part by other univalent ligands such as halogen atoms, OH or NH$_2$ groups, or alkyl groups —CH$_3$, —C$_2$H$_5$, etc. For substitution with OH groups, it is preferable to first carry out a substitution with Br, by placing the polygermin in HBr, followed by substitution of the Br ligand by OH groups in water. Substitution with alkanes preferably takes place by means of hydrosilylation of alkanes. In this connection, the distance between surface planes can vary from 5 to 60 Å, and the luminescence wavelength can vary from 400 to 1600 nm. Doping of the layered germanium polymers to increase conductivity, which is important for the implementation of optoelectronic components, can be carried out by means of intercalation of alkali or earth alkali atoms, preferably with Li, K, or Ca.

In a preferred modification of the invention, the layer polymers demonstrate mixed germanium/silicon layer surface planes. In this way, additional advantageous layer polymers and layer structures are formed.

Silicon/germanium layer polymers in which the individual surface planes comprise a mixture of silicon and germanium atoms can be created, according to the invention, by producing Ca(Si$_{1-x}$Ge$_x$)$_2$ from Si$_{1-x}$Ge$_x$ alloys deposited on suitable crystalline substrates, and performing a subsequent topochemical conversion using solutions containing HCl or H$_2$O, or humid air.

Layer structures that comprise a sequence of individual layers of pure germanium layer polymers and silicon layer polymers can be obtained, according to the invention, through the production of CaGe$_2$/CaSi$_2$ superlattices, for example by means of vapor deposition, sputtering, or molecular beam epitaxy, and subsequent topochemical conversion using solutions containing HCl or H$_2$O. The aforementioned embodiments of the invention involving germanium layer polymers also relate to silicon/germanium layer polymers. Furthermore, the surface plane structures can also contain other semiconductor atoms, or can be formed from them. Semiconductor atoms are understood to mean atoms of materials with semiconductive properties, such as GaAs, AlGaAs, GaAlP, GaN, InGaAlN, for example.

The particular advantages of silicon/germanium layer polymers in optoelectronic components are, among others, the possibility of adjusting the band gap or the photoluminescence merely by varying the relative proportions of the silicon and germanium atoms, respectively, without chemical substitution of ligands, and the possibility of producing "multi-color" luminescence in an optoelectronic component, because silicon layer polymers and germanium layer polymers demonstrate luminescence at different wavelengths.

FIG. 5 shows an optoelectronic component containing a layer polymer according to the invention. Here, a germanium layer polymer 10 is disposed on a substrate 12 comprising crystalline germanium. Preferably, the germanium layer polymer 10 is produced on the germanium substrate 12. In this connection, the germanium substrate acts as an electrical contact at the polymer layer, and can be doped in a known manner in order to reduce the series resistance.

In this connection, the electrical contact to the substrate can be effected by a suitable metallic backside contact 14, for example.

Metallic films or films comprising electrically conductive oxides 16 are applied to the polymer layer 10 as a front side contact. In order for light to be able to pass through the surface of the component, the front side contact is preferably structured to be permeable to radiation. For this purpose, a metallic front side contact can be formed to be sufficiently thin and thereby at least semi-transparent, for example.

In order to improve the diode properties of the component, the layer 10 can be doped. If necessary, the layer 10 is doped with spatial selectivity, only in the vicinity of the transition to the substrate 12, or in the vicinity of the transition to the front side contact 16. Preferably, metals with a low work function, such as Sr, Ca, Mg or Al, are used as a front side contact, p-type doped germanium with a specific conductivity between 0.01 and 1000 1/Ωcm is used as the substrate material, and Al is used as the backside contact. Furthermore, electrically conductive oxides, for example ZnO, SnO or ITO (indium tin oxide) can also be used as the contact material. Of course, the layer polymer 10 can also be a silicon/germanium layer polymer.

With respect to the surface of the germanium substrate, the spatial orientation of the germanium surface planes in the layered polymer depends on the crystal orientation of the substrate. For germanium substrates with a (111) surface, the surface planes of the layered polymers extend parallel to the substrate surface.

The electrical conductivity of the layer polymers is strongly anisotropic, because of their structure, and in this connection, the conductivity parallel to the surface planes is significantly greater than the conductivity perpendicular to them. If the germanium substrate 12 therefore has a (111) surface, the polymer layer 10 has a significantly greater resistance in the component shown in FIG. 5 than in a polymer layer with a comparable thickness that was produced on a substrate oriented differently. In order to reduce the resistance in the polymer layer and to increase the luminescence yield, germanium substrates with an orientation differing from (111) are therefore preferred. Substrates with a (110) surface are particularly preferred for the production of light-emitting diodes and lasers.

An optoelectronic component with a germanium or silicon/germanium layer polymer can be embodied as a light-emitting diode or as a laser, in that charge carriers are electrically injected into the polymer layer. However, it can also be used to detect optical radiation, for example as a photodiode or a photoconductor.

Furthermore, integrated optoelectronic circuits can be implemented using layered germanium and silicon/germanium polymers, in which circuits the semiconductor materials used are preferably based exclusively on germanium, and, in particular, have been produced from the crystalline germanium substrate of the circuit itself. In this connection, light-emitting components with layer polymers according to the invention can be implemented in the construction of light-emitting diodes or lasers, as well as photodetectors for detecting optical radiation, for example by means of pn photodiodes made of crystalline germanium, through selective doping. Furthermore, light-emitting and light-detecting components can also be connected by optical wave guides, for example comprising $GeO_2$ that is formed through selective oxidation of the crystalline germanium.

Of course, the explanation of the invention on the basis of the exemplary embodiments does not limit the invention to these embodiments. When reference is made here to germanium layer polymers, to optoelectronic components based on them, and to their use, this includes silicon/germanium layer polymers as well as layer structures comprising germanium layer polymers and silicon layer polymers.

The invention claimed is:

1. A light emitting polymer material forming a crystal lattice, comprising:
   germanium or germanium-silicon polymers; wherein
   germanium atoms of the germanium polymers form surface planes of the crystal lattice or silicon atoms and germanium atoms of the germanium-silicon polymers form mixed surface planes of the crystal lattice, and said germanium or germanium-silicon polymers are layered on one another to form the crystal lattice; and
   the light emitting polymer material is capable of luminescing.

2. The light emitting polymer material according to claim 1, wherein a molecular formula of the germanium polymer is $(GeH)_n$.

3. The light emitting polymer material according to claim 1, wherein univalent groups are bound to at least a portion of the germanium atoms.

4. The light emitting polymer material according to claim 1, wherein univalent groups are bound to at least a portion of the silicon atoms and/or the germanium atoms.

5. The light emitting polymer material according to claim 4, wherein the univalent groups are halogen atoms, OH groups, $NH_2$ groups, $CH_3$ groups, or alkanes.

6. The light emitting polymer material according to claim 1, wherein the distance between the surface planes is between 5 Å and 60 Å.

7. The light emitting polymer material according to claim 1, wherein the surface planes are separated from one another by intermediate surface planes.

8. The light emitting polymer material according to claim 7, wherein the intermediate surface planes are $(Ca(OH)_2)_n$ planes.

9. The light emitting polymer material according to one of claims 1, 4, 5, 7, or 8, wherein the light emitting polymer material demonstrates a luminescence with a maximum intensity at a wavelength between 400 nm and 1600 nm.

10. A light emitting polymer material structure, comprising a sequence of different layers of polymers, wherein the sequence of different layers includes at least one layer polymer according to claim 1.

11. A method for producing a light emitting polymer material according to claim 1, wherein the polymer material is produced by means of a topochemical conversion of $Ca(Si_{1-x}Ge_x)_2$, $0 < x \leq 1$.

12. The method according to claim 11, wherein an epitaxial $Ca(Si_{1-x}Ge_x)_2$ layer, $0 < x \leq 1$, on a substrate comprising crystalline germanium or silicon/germanium is used for the production of the polymer material.

13. The method according to claim 12, wherein the epitaxial $Ca(Si_{1-x}Ge_x)_2$ layer $0 < x \leq 1$, is produced through deposition of Ca onto a $Si_{1-x}Ge_x$ substrate, $0 < x \leq 1$, with subsequent tempering, through deposition of Ca onto a heated $Si_{1-x}Ge_x$ substrate, $0 < x \leq 1$, though co-deposition of Ca, Ge, and Si onto a substrate with subsequent tempering, or through co-deposition of Ca, Ge, and Si onto a heated substrate.

14. The method according to claim 11, wherein the topochemical conversion is carried out with a fluid that contains HCl or $H_2O$.

15. The method according to claim 11, wherein the topochemical conversion is carried out in air with a relative humidity of 10 to 100%.

16. An optoelectronic component, comprising:
   a crystalline substrate; and
   a layered polymer material containing semiconductor atoms, the semiconductor atoms disposed in surface plane structures layered on top of one another, wherein the layered polymer material is produced by means of a topochemical conversion of $Ca(Si_{1-x}Ge_x)_2$, $0 < x \leq 1$ on the crystalline substrate;
   the polymer material having an epitaxial orientation to the substrate.

17. The optoelectronic component according to claim 16, wherein the layered polymer material is luminescent.

18. The optoelectronic component according to claim 16, wherein the layered polymer material comprises:
   a plurality of germanium or germanium-silicon polymers;
   wherein germanium atoms of the germanium polymers form surface planes of a crystal lattice or silicon atoms and germanium atoms of the germanium-silicon polymers form mixed surface planes of a crystal lattice, and said germanium or germanium-silicon polymers are layered on one another to form the crystal lattice.

19. The optoelectronic component according to claim 16, wherein the crystalline substrate is a germanium substrate or a germanium/silicon substrate.

20. The optoelectronic component according to claim 16, wherein the substrate is oriented such that a surface plane structure of the layered polymer material is not oriented parallel to the surface of the substrate.

21. The optoelectronic component according to claim 20, wherein the substrate has a (110) surface.

22. The optoelectronic component according to claim 16, wherein the substrate is doped.

23. The optoelectronic component according to claim 16, wherein an electrical contact is disposed on the layered polymer material.

24. The optoelectronic component according to claim 23, wherein the electrical contact comprises a metal or an electrically conductive oxide.

25. The optoelectronic component according to claim 23, wherein the contact is translucent.

26. The optoelectronic component according to claim 23, wherein the contact contains Sr, Ca, Mg, Al, Zn, In, ZnO, InO, or InZnO.

27. The optoelectronic component according to claim 16, wherein the layered polymer material is doped in its entirety, or with spatial selectivity.

28. The optoelectronic component according to claim 27, wherein doping is carried out by means of intercalated alkali or earth alkali atoms.

29. The optoelectronic component according to claim 16, wherein the optoelectronic component is a light-emitting diode or a laser diode.

30. The optoelectronic component according to claim 16, wherein the optoelectronic component serves to detect optical radiation.

31. The optoelectronic component according to claim 16, wherein the surface planes are separated from one another by intermediate surface planes.

32. The optoelectronic component according to claim 31, wherein the intermediate surface planes are $(Ca(OH)_2)_n$ planes.

* * * * *

UNITED STATES PATENT AND TRADEMARK OFFICE
CERTIFICATE OF CORRECTION

PATENT NO.         : 7,402,891 B2                                           Page 1 of 1
APPLICATION NO. : 10/239963
DATED                 : July 22, 2008
INVENTOR(S)       : Guenther Vogg, Martin Brandt and Martin Stutzmann It is certified that error appears in the above-identified patent and that said Letters Patent is hereby corrected as shown below:

Column 1, Line 59; replace:
"1, 13, 18, and 34. Advantageous modifications" with
-- 1, 10, 11, and 16. Advantageous modifications --

Signed and Sealed this

Twenty-third Day of September, 2008

JON W. DUDAS
*Director of the United States Patent and Trademark Office*